SELECTIVELY STRIPPING TIN AND/OR LEAD FROM COPPER SUBSTRATES
Filed Sept. 4, 1970
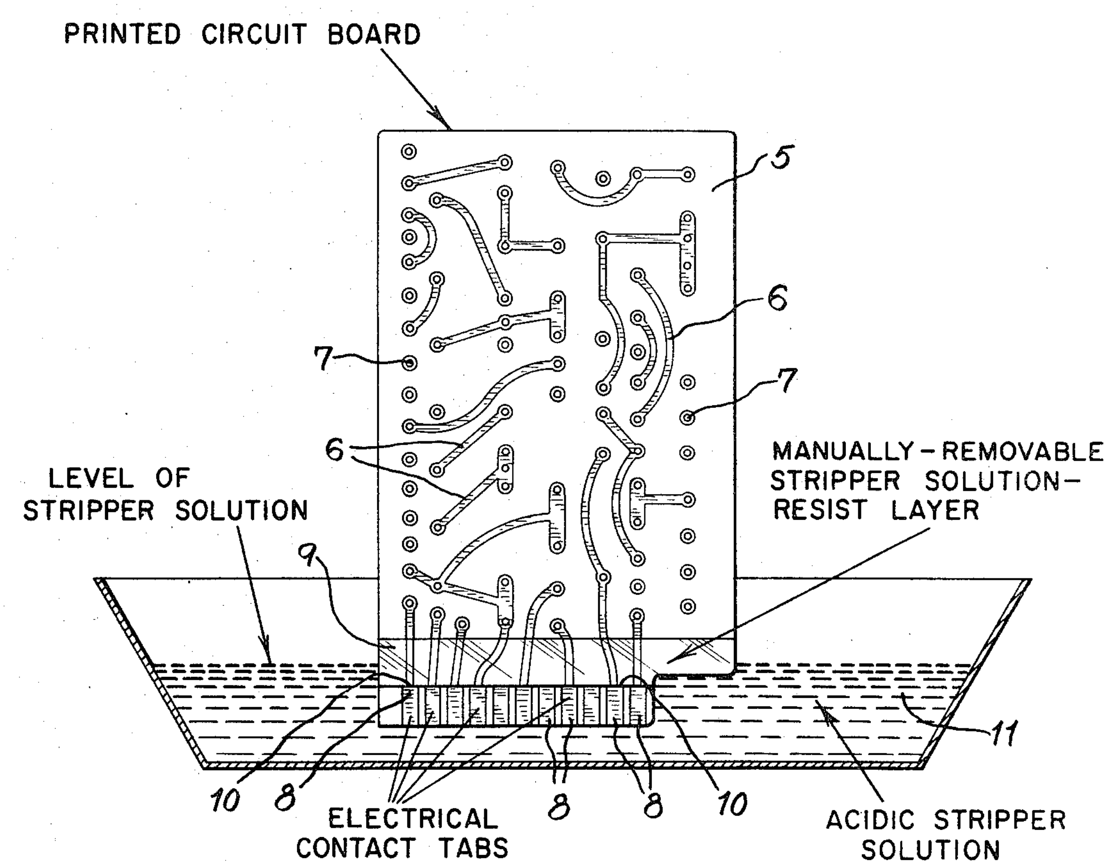
INVENTORS
FRANK BRINDISI, JR.
JOSEPH S. NAGY
EUGENE F. YARKOSKY
BY Roger J. Drew
ATTORNEY

United States Patent Office 3,677,949
Patented July 18, 1972

3,677,949

SELECTIVELY STRIPPING TIN AND/OR LEAD FROM COPPER SUBSTRATES

Frank A. Brindisi, Jr., Madison, Joseph S. Nagy, Watertown, and Eugene F. Yarkosky, Milford, Conn., assignors to Enthone, Incorporated, New Haven County, Conn.

Filed Sept. 4, 1970, Ser. No. 69,769
Int. Cl. C23g *1/06;* H05k *3/06*
U.S. Cl. 252—79.4 15 Claims

ABSTRACT OF THE DISCLOSURE

Acidic solutions for selectively stripping tin and/or lead from copper substrates or surfaces, comprising an aqueous solution of (1) at least one nitro-substituted aromatic compound; (2) an inorganic acid capable of readily reacting with tin and lead to form water-soluble salts thereof and incapable of reacting with tin and lead to form a water-insoluble compound film on the tin, lead or tin-lead alloy surface, preferably fluoboric acid; and (3) a thiourea.

BACKGROUND OF THE INVENTION

(1) Field of the invention

This invention relates to stripping tin and/or lead from a copper substrate, and more particularly to new and improved compositions and method for selectively stripping tin and/or lead from copper substrates or surfaces.

(2) Description of the prior art

Heretofore tin and tin-lead alloy deposits were removed from copper substrates by immersion in solutions of peroxides and an acid such as, for instance fluoroboric and/or acetic acid. Although the tin or tin-lead alloy deposits were stripped from the underlying copper surface, the copper surface was frequently undesirably etched. Furthermore, the peroxide stripper solutions were unstable and hazardous to work with. Ferric nitrate- and ferric chloride-containing stripper solutions have also been utilized in the past to strip tin and tin-lead alloys from copper substrates. Such stripper solutions also were disadvantageous due to frequently etching the copper surface.

Furthermore, in the stripping of the tin and tin-lead alloys from the copper utilizing the peroxide-acetic acid containing stripper solutions, after stripping the tin or tin-lead alloy is effected the tin tends to redeposit on the copper. This redeposition necessitates a second stripping step or operation, which is usually an immersion dip in an alkaline or acid solution, to remove the tin redeposit.

A conventional alkaline stripper solution containing sodium meta-nitro benzoate or benzenesulfonate has been tried for stripping tin-lead solder deposits from contact tabs in the preparation of printed circuit boards, but was unsatisfactory due to causing the epoxy-fiber glass board substrates to swell excessively.

SUMMARY OF THE INVENTION

In accordance with the present invention, acidic solutions especially well suited for stripping tin, lead or tin-lead alloys from copper substrates or surfaces are provided. The acidic solutions comprise an acidic aqueous solution of:

(1) at least one nitro-substituted aromatic compound having at least one —$NO_2$ group attached to the aromatic ring and a water-solubilizing substituent also attached to the aromatic ring;

(2) an inorganic acid capable of readily reacting with tin and lead to form water-soluble salts thereof and incapable of reacting with tin and lead to form a water-insoluble compound film on such metal surface, i.e. tin, lead or tin/lead alloy surface; and (3) a thiourea.

Such solutions constitute a considerable improvement over the prior stripper solutions for stripping tin and/or lead from a copper substrate for the reasons: (1) strips the tin, lead or tin-lead alloys from the copper without any substantial etching or dissolution of the copper; (2) free of peroxide and the hazards attendant with its presence as a constituent; (3) no redeposition of tin on the copper by its use; (4) in connection with (3) supra enables only a one step stripping as contrasted with the two step stripping necessitated by use of the prior stripper solutions; and (5) avoids excessive swelling of epoxy-fiber glass dielectric bases or boards in printed circuit board production.

The stripping method of the invention involves (A) contacting the tin, lead or tin-lead alloy deposit on the copper substrate with the acidic aqueous solution of the nitro-substituted aromatic compound, the inorganic acid capable of readily reacting with tin and lead to form water-soluble salts thereof and incapable of reacting with tin and lead to form a water-insoluble compound film on the metal surface, and the thiourea; and (B) continuing the contacting of the tin, lead or tin-lead alloy on the copper substrate until the tin, lead or tin lead alloy is selectively dissolved from the copper substrate surface.

The contacting of the tin, lead or tin-lead alloy on the copper with the acidic stripper solution is usually by immersing the tin and/or lead in the stripper solution or bath. However, any other suitable way of contacting the tin and/or lead with the stripper solution can be utilized.

The nitro-substituted aromatic compound constituent having one or more —$NO_2$ groups attached to a benzene-ring carbon or carbons and the water-solubilizing substituent also attached to the benzene ring is exemplified by o-, m- and p-nitrobenzene sulfonic acids and mixtures thereof; o-, m- and p-nitrobenzoic acids and mixtures thereof; o-, m- and p-nitrochlorobenzenes and mixtures thereof; o-, m- and p-nitroanilines and mixtures thereof and o-, m- and p-nitrophenols and mixtures thereof. Other suitable nitro-substituted aromatic compounds for use in accordance with this invention are those disclosed in U.S. Pat. 2,649,361 to Spinger and Meyer and U.S. Pat. 2,698,781 to Meyer.

Any inorganic acid capable of readily reacting with tin and lead to form water-soluble salts and which is incapable of forming a water-insoluble compound film on the tin, lead or tin-lead alloy being stripped by reaction with the tin and/or lead is utilizable in the acidic stripper solution of this invention. Exemplary of such inorganic acid constituents are a fluorine-containing inorganic acid e.g. fluoboric acid and fluosilicic acid; and sulfamic acid.

The thiourea constituent is exemplified by thiourea per se; lower alkyl, i.e. 1–4C alkyl, thioureas, e.g. 1,3-dimethyl-2-thiourea, 1,3-diethyl-2-thiourea, 1,3-dipropyl-2-thiourea, and aryl thioureas, e.g. phenyl thiourea.

The thiourea constituent is essential in the stripper solutions of this invention to prevent re-deposition of stripped tin and/or lead onto the copper.

It is essential to avoid formation of a water-insoluble film on the surface of the tin, lead, or tin-lead alloy being stripped, inasmuch as the formation of such insoluble film will prevent stripping of the tin, lead, or tin-lead alloy. For this reason the inorganic acid constituent of the stripping bath herein, which is capable of readily reacting with tin and lead to form water-soluble salts, should also be incapable of forming a water-insoluble compound film on the surface of the tin, lead or tin-lead alloy by reaction with the tin and/or lead.

The constituents of the acidic stripper solutions of this invention are usually present therein in proportions within the following ranges:

| | Grams/liter |
|---|---|
| Nitro-substituted aromatic compound having one or more —$NO_2$ groups and the water-solubilizing substituent also attached to the aromatic ring | About 0.1–180 |
| A thiourea, e.g. thiourea per se | About 0.1–220 |
| An inorganic acid capable of readily reacting with tin and lead to form water-soluble salts and incapable of reacting with tin and lead to form a water-insoluble film, e.g. fluoboric acid | About 3–500 |
| Water | To 1 liter |

The present invention can be utilized to strip tin, lead or tin-lead alloy or solder deposits from any copper substrate or surface for any desired purpose. This invention is especially eminently adapted for selectively stripping the tin-lead alloy solder deposits or layer from the copper-surfaced edge contact tabs or fingers in the preparation of printed circuit boards of this type.

In the embodiment of the method of this invention for selectively stripping the tin-lead binary alloy solder deposits from contact tabs or fingers in the preparation or processing of printed circuit boards, the method involves contacting the tin-lead binary alloy deposits of the contact tabs wherein the tabs each have a tin-lead binary alloy deposit over a copper layer with the aqueous acidic stripper solution of this invention. The contacting of the tin-lead alloy deposits of the tabs is continued until the tin-lead binary alloy or solder deposit is selectively dissolved from the copper.

The contacting of the tin-lead binary alloy deposits of the contact tabs of the printed circuit broads is usually by immersing only the contact tabs of the printed circuit board in the acidic stripper solution. Less preferably the contacting may be effected by spraying.

To facilitate the stripping of the tin-lead binary alloy or solder only from the contact tabs of the boards those portions of the printed circuit board which are immediately adjacent and contiguous with the inner-most end portions of the circuit board are block or masked off with a resist continuous layer which is resistant to and unaffected by the aqueous acidic stripper solution. This masking layer should be one that is readily removable manually or otherwise, and is exemplified by Scotch tape or an electricians dielectric tape which is capable of withstanding and is unaffected by the acidic stripper solution.

With reference to the accompanying drawing which is a diagrammatic sectional view showing the immersing of the contact tabs of a printed circuit board in a bath of the acidic aqueous stripper solution of this invention for the stripping removal of a tin-lead alloy from the copper substrate of the tabs, substrate or base 5 of an epoxy resin-fiber glass laminate or of another suitable dielectric material has circuit pattern 6 thereon with "plated through" through holes 7. Circuit pattern 6 and electrical edge contact fingers or tabs 8 include a layer of copper foil on base 5, a chemical reduction copper layer over the foil, an electrodeposited copper layer over the chemical reduction copper and a tin-lead solder layer of typical composition of 37 weight percent lead and 63 weight percent tin over the electrodeposited copper layer. The walls of through holes 7 have a layer of chemical reduction copper adhered directly to the walls of the epoxy resin-fiber glass laminate of the base 5, with a layer of electrodeposited copper over the chemical reduction copper layer. The opposite side (not shown) of the board also has a circuit pattern of a desired configuration or pattern, through hole inlets, and electrically conductive edge contact fingers or tabs, which are comprised of the metal layers hereinbefore disclosed. The printed circuit board to this point is prepared in conventional manner. Strip 9 of Scotch tape, of typical width of ¾", masks or blocks off those portions of the circuit pattern 6 immediately adjacent and contiguous with the innermost ends 10 of the contact tabs 8, so as to restrict dissolution removal of the lead-tin solder layer from only contact tabs 8. After the stripping removal of the lead-tin solder from the underlying copper of the contact tabs is completed, the immersed end of the circuit board is withdrawn from the bath 11 of acidic stripper solution, the thus-removed board end is rinsed in water, the strip 9 is removed from the board and the exposed copper surfaces of the board contact tabs are then ready for the preferred cleaning and activation cycle prior to the plating of the gold layer, if desired, as is hereinafter described.

A thin layer of gold is usually plated onto the exposed copper surfaces of the contact tabs after the stripping removal of the tin-lead alloy. Any suitable method of plating the gold onto the copper may be utilized, preferably after cleaning and activating the copper substrate. Immersion or ionic displacement plating of the gold onto the copper in conventional manner is an especially suitable method for plating the gold onto the copper of the contact tabs and is recommended. Immersion gold plating compositions are readily obtainable in commerce with one such gold plating composition being that marketed as "Atomex" by Engelhard Minerals and Chemicals Corp., 113 Astor Street, Newark, N.J. The thin gold layer is typically of thickness of 100–150 micro-inches.

Prior to plating the thin gold layer onto the exposed copper of the contact tabs, a thin barrier layer of nickel is usually plated onto and over the exposed copper surfaces of the tabs. The thin gold layer is then plated onto and over the nickel layer. In the absence of this intermediate nickel barrier layer interdiffusion of the gold and copper may occur, and corrosion of the copper when pores are present in the gold layer may also occur with attendant tarnishing of the gold resulting in high contact resistance. The thin nickel layer may be plated onto the copper by any suitable method. One especially suitable method of plating the nickel over the copper is by electrodeposition in conventional manner utilizing an aqueous Ni plating bath of the following exemplary composition:

| | G./l. |
|---|---|
| Nickel sulfate | 240–340 |
| Nickel chloride | 30–60 |
| Boric acid | 30–40 |

The nickel layer has a thickness of typically $\frac{1}{10}$ to $\frac{3}{10}$ of a mil.

The tin-lead alloys stripped by this invention are usually tin-lead binary alloys. The tin-lead binary alloys may contain, by weight, from about 1–99 tin, balance lead. The tin-lead solder alloy which can be stripped from the copper surfaces of the edge contact tabs or fingers of printed circuit boards as previously disclosed herein will typically contain, by weight, about 60% tin, balance lead. Incidental impurities may also be present in the tin-lead alloys stripped by this invention.

DESCRIPTION OF THE PREFERRED EMBODIMENTS

An accelerator of the formula $$RCOOH$$

wherein R is a lower alkyl, for instance methyl or propyl, or aryl group or a hydrogen atom, is preferably utilized in the acidic stripper solutions of this invention to accelerate the rate of stripping removal of the tin and/or lead from the copper substrate. Examples of such accelerators are acetic acid, propionic acid and formic acid with propionic acid being preferred among the two acids. Such organic acid is utilized in the stripper solution in this preferred embodiment in an effective amount, sufficient to accelerate the stripping removal of the tin and/or lead from the copper substrate. This organic acid accelerator constituent is preferably utilized in the stripper solution in amount of about 1.0–120 g./l., more preferably about 10–20 g./l.

When fluoboric acid is a constituent of the stripper solutions of this invention, boric acid is preferably also a constituent of the stripper solution or bath. Fluoboric acid undergoes a reversible reaction in the solution to form HF and $H_3BO_3$ as set forth in the following equation:

$$HBF_4+3H_2O \rightleftarrows 4HF+H_3BO_3$$

This reversible reaction is not desired for the reasons (1) HF that is formed combines with the lead to form the insoluble lead fluoride, i.e. $Pb^{++}+2HF \rightarrow PbF_2\downarrow+2H^+$ and (2) the HF attacks the glass constituent of the epoxy printed circuit board thus etching the board. The addition of the boric acid causes the reversible equilibrium reaction to be shifted to the left in the direction of the desired fluoboric acid, i.e. $HBF_4$, in accordance with the Law of Mass Action. The boric acid constituent, as contrasted with the reaction product boric acid of the reversible reaction, is of course utilized in the stripper solution in an amount sufficient to cause the reversible equilibrium reaction to be shifted to the left, and is preferably utilized as a constituent in an amount within the range of about 1.0–120 g./l., more preferably about 10–60 g./l.

A wetting agent is preferably also a constituent of the acidic stripper solutions. Any suitable wetting agent is utilizable as this constituent and the wetting agent can be one or a plurality of such agents. Exemplary of the wetting agents utilizable herein are nonyl phenoxy polyoxy ethylene ethanol (Igepal CO–630) or tertiary octyl phenoxy polyethoxy ethanol (Triton X–100). A preferred wetting agent is a cationic wetting agent or surfactant of the quaternary ammonium imidazolinium type known as Quaternary-O used in the stripper solution in combination with a polyalkylene glycol type known as polyglycol P–400. The Quaternary-O wetting agent is obtainable from Geigy Industrial Chemicals Co. of Ardsley, N.Y. and the polyglycol P–400 from the Dow Chemical Co. of Midland, Mich. Polyglycol P–400, which is a water-soluble polyalkylene glycol such as a water-soluble polypropylene glycol, is believed to function differently in the stripper solution than does a wetting agent, and appears to form a protective film on the copper substrate after the stripping removal of the tin and/or lead therefrom.

The stripper solutions or baths of the invention preferably contain the following constituents within the ranges specified:

| | Grams/liter |
|---|---|
| Nitro-substituted aromatic compound having one or more —$NO_2$ groups and the water-solubilizing substituent also attached to the aromatic ring, e.g. sodium m-nitro-benzenesulfonate | About 0.1–180 |
| Thiourea | About 0.1–120 |
| Fluoboric acid | About 15–360 |
| Boric acid | About 1–120 |
| Polyglycol P–400 | About 1–120 |
| Quaternary-O | About 1–120 |
| Accelerator (e.g. propionic acid) | About 1–120 |
| Water | To 1 liter |

The following examples further illustrate the invention:

EXAMPLE 1

A plurality of strips of copper-clad epoxy-fiber glass boards each of dimensions of 1" x 12" x 0.125" were electroplated with a tin-lead alloy electrodeposit containing, by weight, 63% tin and 37% lead. The thickness of each board was measured after electroplating and found to be 7.62 micrometers (0.0003"). One of the copper-clad boards was weighed prior to electroplating and found to weigh 22.9566 grams. The electroplating boards were then immersed in an acidic aqueous stripper solution of this invention and of the following composition:

| | Percent by weight |
|---|---|
| Sodium m-nitrobenzenesulfonate | 5.85 |
| Thiourea | 0.68 |
| Fluoboric acid (48%) | 27.44 |
| Propionic acid | 0.91 |
| Boric acid | 0.91 |
| Polyglycol P–400 | 1.83 |
| Quaternary-O | 0.18 |
| Water | 62.2 |

The tin-lead alloy electrodeposits were completely removed from the boards in 4 minutes. After the tin-lead alloy deposits were stripped from the boards, the copper-clad boards were maintained immersed in the stripper solution for an additional period of 30 minutes to 60 minutes.

Upon removal of all boards from the stripper solution, the copper substrates or surfaces of the clad boards were examined and found to be bright and clean, and free of etching or pitting. The copper-clad board that had been weighed prior to electroplating was, after the aforementioned additional 30 minutes immersion in the stripper solution, rinsed in water, dried, and reweighed. This copper clad board weighed 22.9584 grams which amounted to an increase in weight of 0.0018 gram.

EXAMPLE 2

A plurality of strips of copper clad epoxy fiberglass boards each of dimensions of 1" x 12" x 0.125" were plated with tin by immersion in a proprietary immersion tin plating bath. The thickness of the tin deposit was measured after plating and found to be 2.54 micrometers (0.0001"). The tin plated boards were then immersed in an acidic aqueous stripper solution of the same composition as set forth in Example 1 herein. The tin deposits were completely removed from all boards in 1¼ minutes. After the stripping removal of the tin deposits, the copper clad boards were retained in the stripping solution for an additional period of from 30 minutes to 60 minutes.

Upon removal of the copper clad boards from the stripper solution, the copper substrates or surfaces of the boards were examined and found to be clean and bright and free of etching and pitting.

EXAMPLE 3

A piece of lead foil of dimensions of 1" x 1" x 0.001" was immersed in an acidic aqueous stripper solution of this invention and of the same composition as that of Example 1 herein.

The lead foil completely dissolved in the stripper solution in 12 minutes.

EXAMPLE 4

A piece of copper clad epoxy-fiberglass board was electroplated with a tin-lead alloy deposit containing, by weight, 63% tin and 37% lead. The board piece was weighed just before the electroplating and was found to weigh 11.8110 grams. The thickness of the tin-lead electrodeposit on the board was measured after the electroplating and found to be 13.45 micrometers (0.00053") in thickness. The thus plated board piece was then immersed in an acidic peroxide stripper solution of the following composition:

| | Ml. |
|---|---|
| Hydrogen peroxide (30%) | 60 |
| Fluoboric acid | 128 |
| Water | 384 |

The temperature of the stripper solution was 25° C. The time required to completely strip the tin-lead deposit from the copper substrate was 15 minutes. The copper clad board portion was allowed to remain immersed in the stripper solution for an additional 30 minutes after the tin-lead deposit had been stripped from the copper. The board was then rinsed in water, dried and reweighed. The board weighed 11.6846 grams and therefore 0.1264 gram was lost by the stripping. This peroxide bath was difficult to work with and was quite unstable.

EXAMPLE 5

An acidic stripping solution was prepared utilizing the same constituents as employed in the stripping solution of Example 1 herein except that the thiourea was omitted from this solution of Example 5. The stripping solution had the following composition:

| | Percent by weight |
|---|---|
| Sodium m-nitrobenzene sulfonate | 5.40 |
| Fluoboric acid (48%) | 30.00 |
| Propionic acid | 1.00 |
| Boric acid | 1.00 |
| Polyglycol P–400 | 0.50 |
| Quaternary-O | 0.10 |
| Water | 62.00 |

This solution was used full strength at room temperature as a stripper for a tin-lead alloy. A copper clad epoxy-fiber glass board of dimensions of 1" x 12" x 0.125", which had been electroplated with a tin-lead alloy electrodeposit containing, by weight, 63% tin and 37% lead and of 0.0001" thickness over the copper, was immersed in this solution. The time required to completely strip the tin-lead alloy electrodeposit from the copper was 1 minute and 15 seconds. However a gray thin coating of tin redeposited on the copper which was unsatisfactory.

What is claimed is:

1. An acidic aqueous solution for selectively stripping a material selected from the group consisting of tin or a tin-lead alloy solder from a copper substrate comprising:

(1) about 0.1–180 grams per liter of a nitro-substituted aromatic compound having at least one —$NO_2$ group attached to the aromatic ring and a water-solubilizing substituent also attached to the aromatic ring;

(2) about 3–500 grams per liter of an inorganic acid capable of reacting with tin and lead to form water-soluble salts thereof and incapable of reacting with tin and lead to form a water-insoluble compound film and selected from the group consisting of a fluorine-containing inorganic acid and sulfamic acid; and (3) about 0.1–220 grams per liter of a thiourea selected from the group consisting of thiourea per se, 1–4C alkyl thioureas, and phenyl thiourea, the selected thiourea constituent preventing re-deposition of stripped tin onto the copper.

2. The solution of claim 1 wherein the inorganic acid is the fluorine-containing acid.

3. The solution of claim 2 wherein the fluorine-containing acid is fluoboric acid.

4. The solution of claim 2 wherein the fluorine-containing acid is fluosilicic acid.

5. The solution of claim 1 wherein the inorganic acid is sulfamic acid.

6. The solution of claim 1 also containing an accelerator of the formula

RCOOH wherein R is 1–2C alkyl or a hydrogen atom.

7. The solution of claim 3 wherein the fluoboric acid is contained therein in amount within the range of about 15–360 grams per liter, and the selected thiourea is thiourea per se and is contained therein in amount within the range of about 0.1–120 grams per liter.

8. The solution of claim 1 wherein the selected thiourea is thiourea per se.

9. In a method for stripping a material selected from the group consisting of tin and a tin-lead alloy solder deposited on a copper substrate from the copper comprising contacting said material deposited on the copper substrate with an acidic aqueous solution comprising at least one nitro-substituted aromatic compound having at least one —$NO_2$ group attached to the aromatic ring and a water-solubilizing substituent also attached to the aromatic ring, and an inorganic acid capable of reacting with tin and lead to form water-soluble salts thereof and incapable of reacting with tin and lead to form a water-insoluble film thereon, and continuing the contacting of the said material on the copper substrate with the acidic aqueous solution until said material is dissolved from the copper substrate surface, the improvement whereby re-deposition of the dissolved tin onto the copper substrate is prevented which comprises having present in the acidic aqueous stripping solution during the contacting a thiourea selected from the group consisting of thiourea per se, 1–4C alkyl thioureas, and phenyl thiourea, the selected thiourea being present therein in an amount sufficient to prevent re-deposition of the dissolved tin onto the copper substrate.

10. The method of claim 9 wherein the inorganic acid is selected from the group consisting of fluoboric acid, fluosilicic acid and sulfamic acid.

11. The method of claim 10 wherein the nitro-substituted aromatic compound is present in the acidic aqueous solution in amount of about 0.1–180 grams per liter, the selected inorganic acid therein in amount of about 3–500 grams per liter, and the selected thiourea therein in amount of about 0.1–220 grams per liter.

12. The method of claim 9 wherein the selected material which is stripped from the copper is a tin-lead alloy solder deposited on contact tabs of printed circuit boards, the contact tabs each having the tin-lead alloy solder deposit over a copper layer on the tab.

13. The method of claim 12 wherein the inorganic acid is selected from the group consisting of fluoboric acid, fluosilicic acid and sulfamic acid.

14. The method of claim 12 wherein the tin-lead alloy solder deposit is selectively dissolved from the copper of the tabs by immersing the tin-lead alloy solder deposits of only the contact tabs in the aqueous acidic solution.

15. The method of claim 11 wherein the acidic stripper solution also contains about 1–120 grams per liter of an accelerator of the formula

RCOOH wherein R is 1–2C alkyl or a hydrogen atom.

References Cited

UNITED STATES PATENTS

| | | | |
|---|---|---|---|
| 2,698,781 | 1/1955 | Meyer | 252—79.4 |
| 2,177,751 | 10/1939 | Sikovski | 252—79.4 |
| 3,367,874 | 2/1968 | Haviland | 252—79.2 |

JACOB H. STEINBERG, Primary Examiner

U.S. Cl. X.R.

156—3, 18, 345

PO-1050
(5/69)

UNITED STATES PATENT OFFICE

CERTIFICATE OF CORRECTION

Patent No. 3,677,949 Dated July 18, 1972

Inventor(s) Frank A. Brindisi, Jr., Joseph S. Nagy & Eugene F. Yarkosky

It is certified that error appears in the above-identified patent and that said Letters Patent are hereby corrected as shown below:

Column 3, line 44, "block" should read --blocked--. Column 5, line 38, "polyglycol" should read --Polyglycol--; line 40 "polyglycol" should read --Polyglycol--.

Signed and sealed this 8th day of May 1973.

(SEAL)
Attest:

EDWARD M.FLETCHER,JR.
Attesting Officer

ROBERT GOTTSCHALK
Commissioner of Patents